United States Patent
Loke et al.

(10) Patent No.: US 9,356,555 B2
(45) Date of Patent: May 31, 2016

(54) FINE TUNING CONTROL FOR A DIGITALLY CONTROLLED OSCILLATOR

(71) Applicant: Samsung Electronics Co., Ltd., Gyeonggi-do (KR)

(72) Inventors: Wing Fai Loke, San Jose, CA (US); Chih-Wei Yao, Sunnyvale, CA (US); Sunghwan Kim, Los Gatos, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/551,970

(22) Filed: Nov. 24, 2014

(65) Prior Publication Data

US 2016/0079919 A1    Mar. 17, 2016

Related U.S. Application Data

(60) Provisional application No. 62/050,431, filed on Sep. 15, 2014.

(51) Int. Cl.
*H03B 5/12* (2006.01)

(52) U.S. Cl.
CPC .............. *H03B 5/1212* (2013.01); *H03B 5/124* (2013.01)

(58) Field of Classification Search
CPC .......... H03B 5/08; H03B 5/12; H03B 5/1206; H03L 1/04
USPC ......................... 331/117 R, 117 FE, 167, 176
See application file for complete search history.

(56) References Cited

U.S. PATENT DOCUMENTS

| | | | |
|---|---|---|---|
| 6,606,004 B2 | 8/2003 | Staszewski et al. | |
| 7,352,297 B1 | 4/2008 | Rylyakov et al. | |
| 7,714,665 B2 | 5/2010 | Waheed et al. | |
| 7,750,701 B2 | 7/2010 | Ainspan et al. | |
| 8,106,714 B2 | 1/2012 | Oh et al. | |
| 8,125,285 B2 | 2/2012 | Titus | |
| 8,299,862 B1 * | 10/2012 | De Bernardinis | H03B 5/1228 331/117 FE |
| 8,536,916 B1 | 9/2013 | van Engelen et al. | |
| 8,559,579 B2 | 10/2013 | Staszewski et al. | |
| 2003/0052809 A1 * | 3/2003 | Kuttner | H03M 1/069 341/162 |
| 2010/0060503 A1 * | 3/2010 | Sakakibara | H03M 1/20 341/161 |
| 2011/0012657 A1 | 1/2011 | Hsieh et al. | |
| 2011/0267122 A1 | 11/2011 | Jeong et al. | |
| 2014/0015589 A1 * | 1/2014 | Morris, III | H03H 19/004 327/337 |

OTHER PUBLICATIONS

Da Dalt, Nicola et al., A 10b 10GHz Digitally Controlled LC Oscillator in 65nm CMOS, 2006 IEEE International Solid-State Circuits Conference, pp. 10.

Fanori, Luca et al., 3.3GHz DCO with a Frequency Resolution of 150Hz for All-Digital PLL, 2010 International Solid-State Circuits Conference, pp. 3.

(Continued)

*Primary Examiner* — Jeffrey Shin
(74) *Attorney, Agent, or Firm* — The Farrell Law Firm, P.C.

(57) ABSTRACT

Methods, apparatuses, and systems for providing a variable capacitance using an array of capacitor cells are discussed. In the fine tuning bank of an inductor/capacitor (LC)-tank of a digitally controlled oscillator (DCO), control is implemented by selecting a boundary cell from the array of capacitor cells and having every cell before the boundary cell in a circuit path be grounded and having the boundary cell and every cell after the boundary cell in the circuit path be connected to a voltage source. The circuit path may be the one formed by using thermometer coding in the fine tuning bank.

19 Claims, 6 Drawing Sheets

(56) References Cited

OTHER PUBLICATIONS

Oh, Do-Hwan et al., A 2.8Gb/s All-Digital CDR with a 10b Monotonic DCO, 2007 IEEE International Solid-State Circuits Conference, pp. 3.

Fanori, Luca et al., Capacitive Degeneration in LC-Tank Oscillator for DCO Fine-Frequency Tuning, IEEE Journal of Solid-State Circuits, vol. 45, No. 12, Dec. 2010, pp. 9.

Hung, Chih-Ming et al., A Digitally Controlled Oscillator System for Saw-Less Transmitters in . . . , IEEE Journal of Solid-State Circuits, vol. 41, No. 5, May 2006, pp. 11.

Staszewski, Robert Bogdan et al., A Digitally Controlled Oscillator in a 90 nm Digital CMOS . . . , IEEE Journal of Solid-State Circuits, vol. 40, No. 11, Nov. 2005, pp. 9.

Staszewski, Robert Bogdan et al., A First Multigigahertz Digitally . . . , IEEE Transactions on Microwave Theory and Techniques, vol. 51, No. 11, Nov. 2005, pp. 11.

Staszewski, Robert Bogdan et al., All-Digital PLL and Transmitter for Mobile Phones, IEEE Journal of Solid-State Circuits, vol. 40, No. 12, Dec. 2005, pp. 14.

Vercesi, L. et al., A Dither-less All Digital PLL for Cellular Transmitters, Copyright 2011 IEEE, pp. 8.

Xu, Ruoyu et al., Digitally Calibrated 768-kS/s 10-b Minimum-Size SAR ADC Array with Dithering, IEEE Journal of Solid-State Circuits, vol. 47, No. 9, Sep. 2012, pp. 12.

Yao, Chih-Wei et al., A 2.8-3.2-GHz Franctional-N Digital PLL with ADC-Assisted TDC and . . . , IEEE Journal of Solid-State Circuits, vol. 48, No, 3, Mar. 2013, pp. 13.

Zianbetov, Elder et al., A Digitally Controlled Oscillator in a 65-nm CMOS process for SoC clock generation, Copyright 2011 IEEE, pp. 4.

\* cited by examiner

FINE TUNING CONTROL FOR A DIGITALLY CONTROLLED OSCILLATOR

PRIORITY

The present application claims priority under 35 U.S.C. §119(e) to U.S. Provisional Application No. 62/050,431, entitled "New Fine Tuning Control for Digitally Controlled Oscillator," which was filed on Sep. 15, 2014, the contents of which are incorporated herein by reference.

BACKGROUND OF THE INVENTION

1. Field of the Invention

The present invention relates generally to the fine tuning of a digitally controlled oscillator (DCO), and more particularly to reducing the complexity in implementing the fine tuning bank of an inductor/capacitor (LC)-tank DCO.

2. Description of the Related Art

All digital phase locked loops (ADPLLs) are used for various functions in a wide variety of electronic components, including for frequency synthesis for wireless transmission/reception in portable devices. The heart of the ADPLL is the digitally controlled oscillator (DCO). One way to implement a DCO is by using an LC oscillator which has two or more capacitance banks for digital tuning (an LC-tank DCO).

FIG. 1A is simple schematic of the tuning scheme of an LC-tank DCO, taken from FIG. 2.6.1 of L. Fanori et al., "3.3 GHz DCO with a Frequency Resolution of 150 Hz for All-Digital PLL," *IEEE ISSCC Tech. Dig.*, pp. 48-49, February 2010 (hereinafter, Fanori et al.), the contents of which are incorporated herein by reference. At the top is the impedance ($L_{Tank}$), with the Coarse Tuning capacitance bank below the $L_{Tank}$ and the Fine Tuning capacitance bank at the bottom. The Coarse Tuning bank is used to compensate for process and temperature variations, while the Fine Tuning bank is used for DCO modulation inside the PLL.

The input to an LC-tank DCO is a frequency code word (fcw), made up of digital bits. Some of the bits in the fcw control the Coarse Tuning bank and some of the bits control the Fine Tuning Bank. In the example shown in FIG. 1B, taken from FIG. 2.6.2 of Fanori et al., the input fcw comprises two sets of bits $C_0, C_1, \ldots, C_6, C_7$, and $b_0, b_1, \ldots, b_{11}, b_{12}$. The eight bits $C_0, \ldots, C_7$, are used to control the Coarse Tuning bank and the thirteen bits $b_0, \ldots, b_{12}$ are used to control the Fine Tuning bank. Accordingly, each fcw can identify a specific capacitance.

How the thirteen bits $b_0, \ldots, b_{12}$ control the Fine Tuning bank to generate different capacitances is indicated by the example of FIG. 1C, taken from FIG. 6 of L. Vercesi et al., "A Dither-less All Digital PLL for Cellular Transmitters," in *Proc. IEEE Custom Integrated Circuits Conf (CICC)*, pp. 1-8, September 2011 (hereinafter, Vercesi et al.), the contents of which are incorporated herein by reference. In FIG. 1C, a 16×16 capacitive element array for the Fine Tuning bank is shown, similar in appearance and control to a memory cell array, but used to generate specific capacitances corresponding to the input fcw. The thirteen-bit control word is broken in three, where bits $b_9, b_{10}, b_{11}, b_{12}$ are input to the row decoder (thereby picking one of 16 rows), bits $b_5, b_6, b_7, b_8$ are input to the column decoder (thereby picking one of 16 columns), and bits $b_0, b_1, b_2, b_3$ are input to a digital-to-analog converter (DAC) to provide 16 additional voltage levels at one varactor in the array (in black). Thus, a total of 12 DCO control bits are available, generating 4096 different levels of capacitance.

The Fine Tuning bank also uses thermometer coding. In general, thermometer coding represents (or "encodes") a natural number n as n ones, which is either preceded by or followed by zeroes. The encoding can use n zeroes, or n−1 ones, or n−1 zeroes, etc., as would be known to one of skill in the art. In the Fine Tuning bank, thermometer coding means that every cell before the selected cell has one value and every cell after has another. In FIG. 1C, the top row is row 0 and bits $b_9, b_{10}, b_{11}, b_{12}$=0,1,0,1 are input to the row decoder, indicating row 5 (the $6^{th}$ row down). In thermometer coding, rows 1-4 have to be turned on/off, or in this case, be grounded to Gnd as indicated by the grey color in FIG. 1C (this will be considered ON hereinafter while connected to a source voltage, in this case, $V_{dd}$, will be considered OFF). Bits $b_5, b_6, b_7, b_8$=0,1,1,1 are input to the column decoder, indicating column 7 (the eighth column). Under thermometer coding, every cell before that cell is ON and every cell after that cell is OFF. While the use of thermometer coding ensures monotonicity in such an array of capacitive unit cells, it also means that a large number of control lines is needed to control the unit cells.

Moreover, in this example, as shown in the upper right-hand corner of FIG. 1C, each cell requires a local decoder having an AND gate with the row and column line inputs ($r_j$ and $c_i$) and an OR gate taking the output of the AND gate and the next row's input ($r_{j+1}$). Thus, each row line has to drive double the load. In general, although the control lines are reduced in FIG. 1C, each control line is connected to more cells. Since a row control line is connected to all of the cells in that row, any activity to control a single cell acts as noise to the other cells. Furthermore, when dithering of the cells is required, and the cells need to turn on and off in a meandering pattern, the activity in the control lines is greatly increased.

In N. Da Dalt et al., "A 10b 10 GHz Digitally Controlled LC Oscillator in 65 nm CMOS," *IEEE ISSCC Tech. Dig.*, pp. 669-678, February 2006 (hereinafter, Da Dalt et al.), the contents of which are incorporated herein by reference, the columns of the capacitive array are divided into even and odd, thereby reducing the activity in each control line. However, two types of local decoder are needed, one for the even columns and one for the odd columns, and when metal-oxide-metal (MOM) capacitors are used, the different local decoders are placed under the MOM capacitors to save space, resulting in slightly different capacitances and more mismatches between capacitive cells.

Thus, there are several problems in designing a Fine Tuning capacitor bank for an LC-tank DCO. In general, there are usually too many control lines. See, e.g., C.-Y. Yao et al., "A 2.8-3.2-GHz fractional-N Digital PLL with ADC-assisted TDC and Inductively Coupled Fine-tuning DCO," *IEEE J. Solid-State Circuits*, vol. 48, no. 3, pp. 698-710, 2013 (each cell requires 4 control lines, resulting in 128 control lines for a 10-bit capacitor array). Efforts to reduce the number of control lines result in the control lines having to drive larger loads, creating more noise in the array, and, when dithering, a great deal of activity toggling the fewer control lines resulting in more noise and power consumption. See, e.g., Vercesi et al. and Fanori et al. discussed above.

Accordingly, there is a need for systems, devices, and methods for reducing the control lines in the Fine Tuning bank of an LC-tank DCO, without increasing the complexity of the Fine Tuning bank circuitry, without increasing the load on the fewer control lines, and without greatly increasing activity when dithering.

SUMMARY OF THE INVENTION

Accordingly, the present invention has been made to address at least the problems and/or disadvantages described above and to provide at least the advantages described below.

In one aspect of the present invention, fewer control lines are used in controlling the Fine Tuning bank of an LC-tank DCO. In another aspect of the present invention, the number of control lines for the Fine Tuning bank that needs to be toggled during dithering is significantly reduced. In yet another aspect of the present invention, each control line only drives the current row or column and does not have to drive the previous row or column. In still another aspect of the present invention, the layout for each cell in the Fine Tuning bank is the same, thereby reducing design efforts and resources.

According to one aspect of the present invention, an array of capacitor cells that produce a variable capacitance include n row control lines; n column control lines; and an n×n array of capacitor cells which varies its overall capacitance by thermometer coding forming a path through the n×n array, each capacitor cell including a feeder input for at least one of output of a previous cell in the path or output from a feeder line; a column control line input; a row control line input; and an output for the feeder input of a next cell in the path, wherein each cell in the array is in one of two states; wherein a boundary cell is selected by asserting its row control line input among the n row control lines and asserting its column control line input among the n column control lines, wherein all cells before the boundary cell in the path output a value input by the feeder line into the first cell in the path, wherein the boundary cell and all cells after the boundary cell in the path output a value opposite to the value input by the feeder line into the first cell in the path, and wherein each cell before the boundary cell in the path is in a first state of the two states, and the boundary cell and each cell after the boundary cell is in a second state of the two states.

According to another aspect of the present invention, a method for producing a variable capacitance includes asserting a row control line and a column control line to select a boundary cell in an array of capacitor cells which varies its overall capacitance by thermometer coding forming a path through the array, wherein each cell in the array is either grounded or electrically connected to a voltage source; and providing a specific capacitance whose value is determined by having all cells before the boundary cell in the path being grounded, and having the boundary cell and all cells after the boundary cell in the path being electrically connected to the voltage source.

BRIEF DESCRIPTION OF THE DRAWINGS

The above and other aspects, features, and advantages of embodiments of the present invention will be more apparent from the following detailed description taken in conjunction with the accompanying drawings, in which.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Various embodiments may comprise one or more elements. An element may comprise any structure arranged to perform certain operations. Although an embodiment may be described with a limited number of elements in a certain arrangement by way of example, the embodiment may include more or less elements in alternate arrangement as desired for a given implementation. It is worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

In order to reduce the amount of control lines from the row and column decoders and the amount of activity in each control line during dithering, a novel fine-tuning control scheme is provided by embodiments of the present invention. Instead of controlling each cell to turn on and off using the control lines, the novel scheme only uses the control lines to identify the "boundary cell" between the on and the off cells. As only the boundary cell needs to be identified, only one row control signal and one column control signal need to be active at any instant to identify the boundary cell. This reduces the number of control lines as well as the amount of activity in the control lines in general.

Figure 1B:
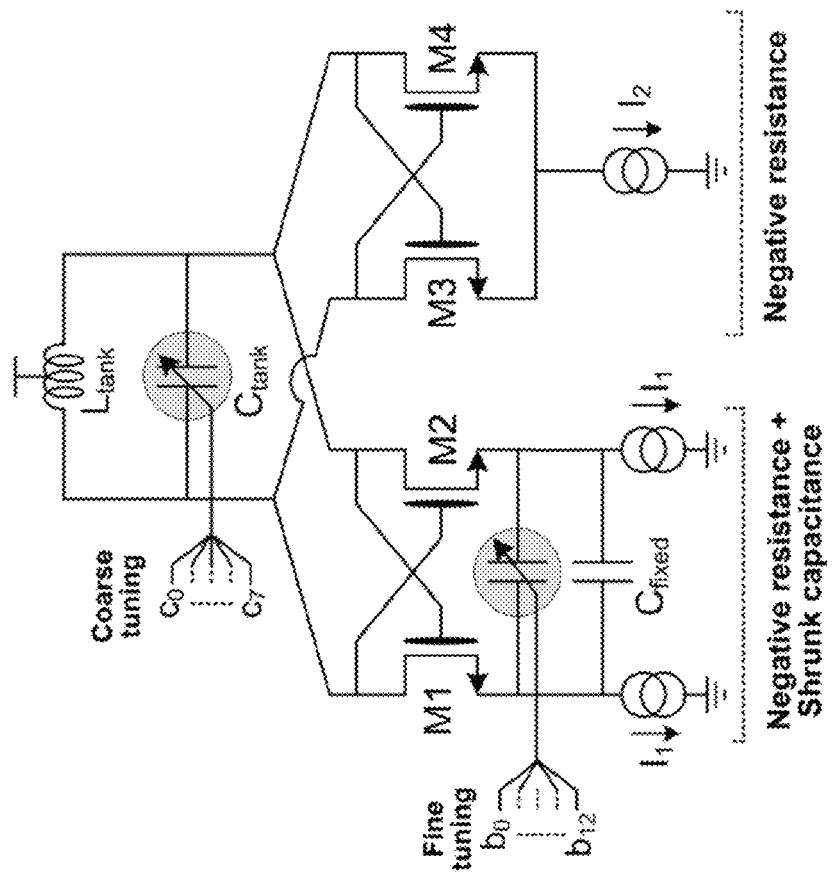
FIG. 1B is a more detailed diagram of the tuning scheme of an LC-tank DCO, showing the sets of bits of the frequency code word used as input to the Coarse Tuning bank and the Fine Tuning bank, to which embodiments of the present invention may be applied.
Figure 1A:
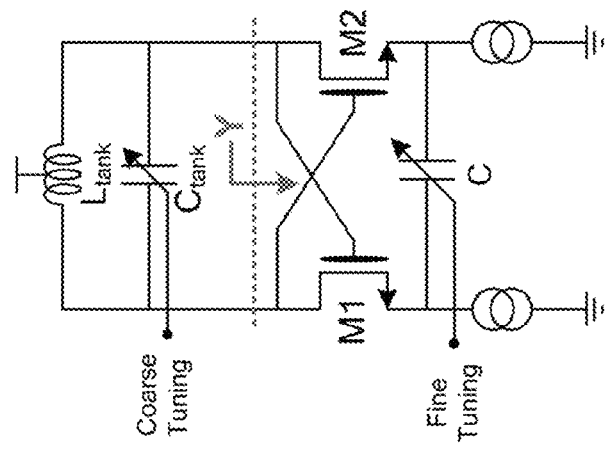
FIG. 1A is a simplified schematic of the tuning scheme of an LC-tank DCO, to which embodiments of the present invention may be applied.
Figure 1C:
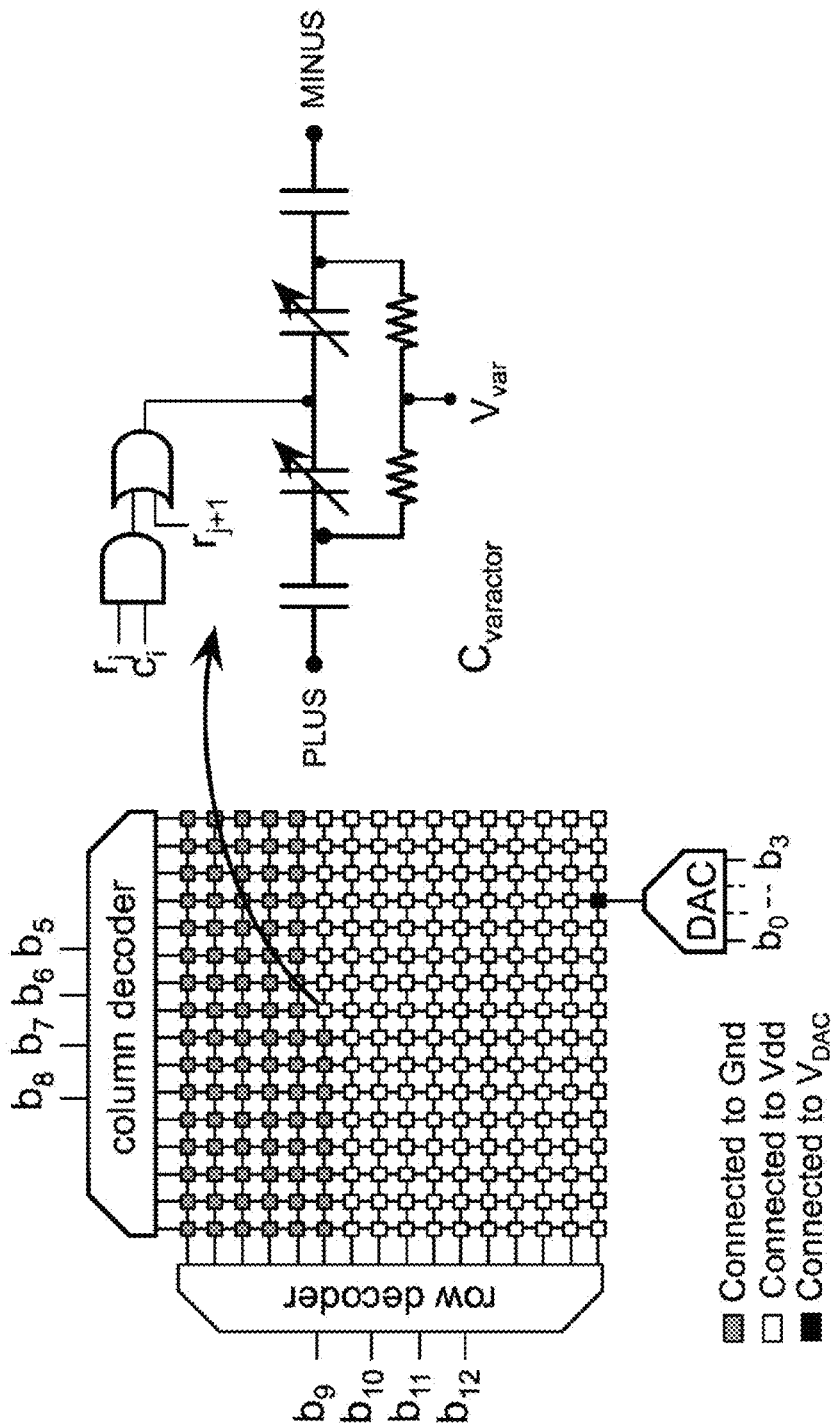
FIG. 1C is a diagram of a Fine Tuning bank comprising an array of capacitive cells which assert a variable capacitance according to input bits using thermometer coding.
Figure 2:
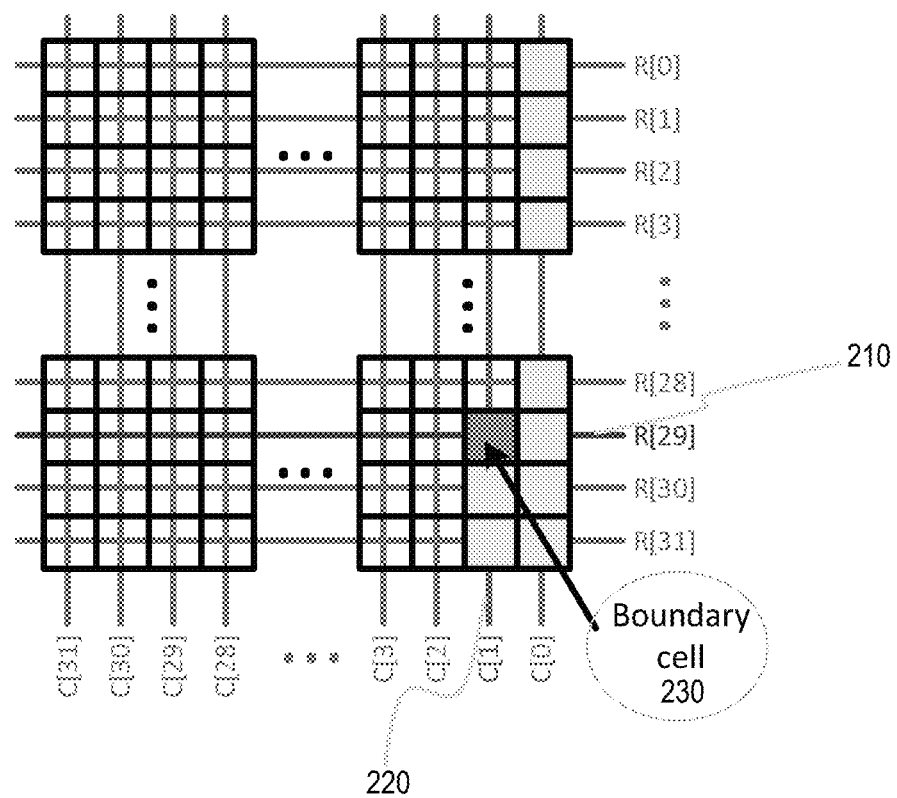
FIG. 2 is a diagram of a Fine Tuning bank comprising an array of capacitive cells according to an embodiment of the present invention.

A diagram of a Fine Tuning bank comprising an array of capacitive cells according to an embodiment of the present invention is shown in FIG. 2. In this example, there is a 10-bit input control word for the Fine Tuning bank, thereby requiring a capacitor array with $2^{10}=1024$ cells=32×32 array. The ten bits are divided into two sets of 5 bits, one to select the column, the other to select the row. Each set of 5 bits can select one out of ($2^5=$) 32 columns or rows (i.e., 0-31); thus, FIG. 2 has control lines R[0] through R[31] for the 32 rows, and control lines C[0] through C[31] for the thirty-two columns. Unlike the previous example (FIG. 1C), the thermometer coding in FIG. 2 fills up column-by-column rather than row-by-row. Moreover, the thermometer coding takes a serpentine route through the array, meaning that the first column is filled downwards, R[0] to R[31], while the second column is filled upwards, R[31] to R[0], and third column is filled downwards, R[0] to R[31], etc. That is why after the first column is filled in FIG. 2, the second column is being filled starting at the bottom of the second column (R[31]), rather than the top (R[0]).

In an embodiment of the present invention, only the boundary cell between the ON cells and the OFF cells is designated using the control lines. In other words, only control line R[29] 210 and control line C[1] 220 are asserted in FIG. 2, thereby indicating boundary cell 230. Previously, for example, there would be an additional control line for each column, e.g., w[0]-w[31], which would be used with the row and column control lines. w[0]=1 and c[0]=1 would turn on all of the rows in the first column, while w[1]=1 and c[1]=0 would enable the row control lines in the second column to turn on the bottom three cells (i.e., R[29]=1, R[30]=1, and R[31]=1). Beyond the second column (32≥n≥2), w[n]=0 and c[n]=0 would turn all cells off.

By contrast, the embodiment of the present invention in FIG. 2 only uses control line 210 R[29]=1 and control line 220 C[1]=1 to thereby indicate where the serpentine thermometer coding stops, at boundary cell 230.

Figures 3A, 3B:
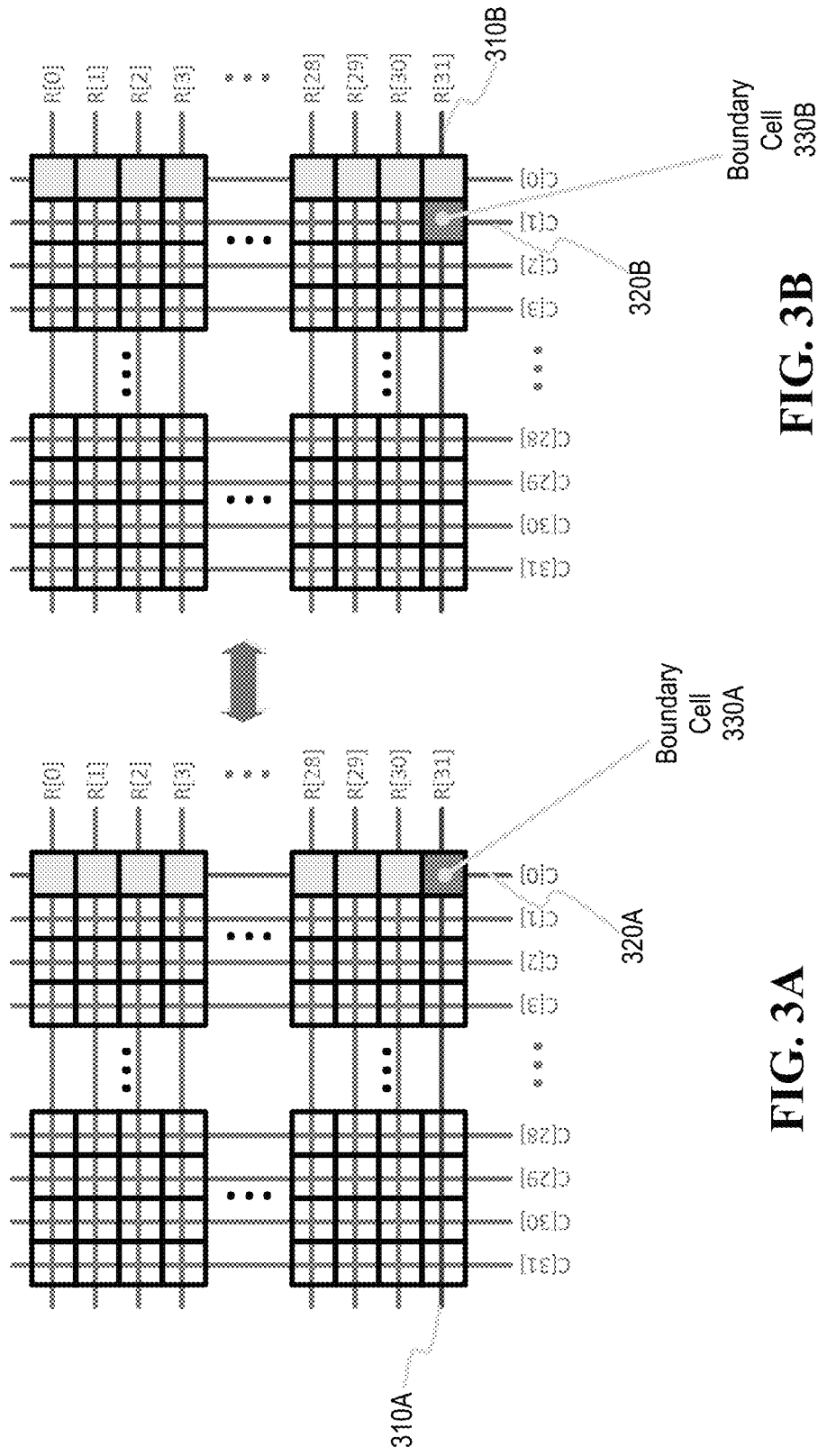
FIGS. 3A and 3B shows dithering in a Fine Tuning bank comprising an array of capacitive cells according to an embodiment of the present invention.

FIGS. 3A and 3B shows dithering in a Fine Tuning bank comprising an array of capacitive cells according to an embodiment of the present invention. When dithering, the cells comprising several consecutive values are toggled on and off in succession. In FIG. 3A, boundary cell 330A is being toggled, resulting in the entire column being on. According to an embodiment of the present invention, only control lines R[31] 310A and C[0] 320A need to be asserted, as shown in FIG. 3A. In FIG. 3B, the next cell 330B in the meandering path is toggled on, by asserting (or keeping asserting) control line R[31] 310B and C[1] 320B.

Previously, when an additional control line was used for each column, e.g., w[0]-w[31], w[0]=1 and c[0]=0 would enable all of the rows in the first column to be turned on, while every single row line would have to be asserted (i.e., R[0]=R[1]= . . . =R[30]=R[31]=1) in order to toggle on the capacitance value shown in FIG. 3A. When toggling on the next consecutive capacitance value, as shown in FIG. 3B, w[0]=1 and c[0]=1 would turn the entire first column on, while w[1]=1 and R[31]=1 would turn on cell 330B. Such an abrupt and drastic change in control line activity, from 33 control lines being asserted in FIG. 3A to only 4 lines being asserted in FIG. 3B, during dithering would result in a great deal of noise in the adjacent inactive cells as well as the DCO output.

By contrast, an embodiment of the present invention during the dithering shown in FIGS. 3A and 3B only uses two control lines for both consecutive capacitance values shown in each of FIGS. 3A and 3B, thereby minimizing noise and the other ill effects of drastic and/or abrupt changes in control line activity.

The logic for each cell in a Fine Tuning capacitive cell array bank according to an embodiment of the present invention has some simple state rules. The state of each cell is dependent on the state of the previous cell. Thus, a cell is turned ON if the previous cell was ON, and a cell is turned OFF if the previous cell was OFF. The boundary cell is the one exception, because the boundary cell is the opposite of the preceding cell, thereby making all following cells opposite to the cells before the boundary cell.

Figure 4:
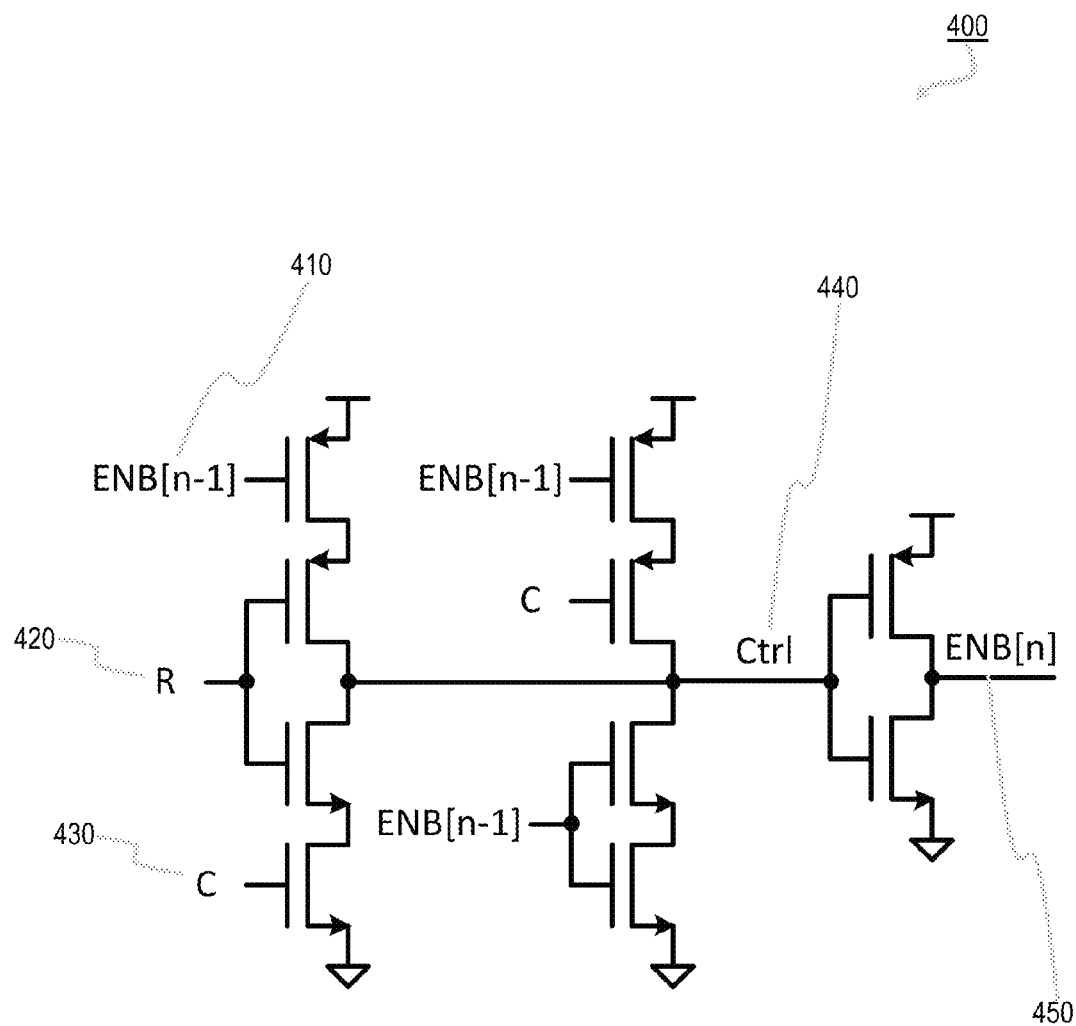
FIG. 4 is a circuit diagram for a MOS implementation for the decoder logic of each cell in a Fine Tuning capacitive cell bank according to an embodiment of the present invention.

One way to implement such logic is shown in FIG. 4. FIG. 4 is a circuit diagram for a Metal-Oxide Semiconductor (MOS) implementation of the decoder logic 400 for each cell in a Fine Tuning capacitive cell bank according to an embodiment of the present invention. The ENB signal is taken from the previous cell (ENB[n−1] 410), and is used to produce the ENB signal (ENB[n] 450) which will be input in the next cell. The only other inputs are the row control line R 420 and column control line C 430. Table 1 below is the truth table for the local decoder logic shown in FIG. 4. Of course, as would be understood to one of ordinary skill in the art, FIG. 4 and Table 1 are only examples, and many other logic implementations and truth tables are possible in accordance with embodiments of the present invention.

TABLE 1

Truth Table for Local Decoder 400 in FIG. 4

| ENB[n−1] 410 | Col 430 | Row 420 | Ctrl 440 | ENB[n] 450 | State |
|---|---|---|---|---|---|
| 0 | 0 | 0 | 1 | 0 | On |
| 0 | 0 | 1 | 1 | 0 | |
| 0 | 1 | 0 | 1 | 0 | |
| 0 | 1 | 1 | 0 | 1 | Off (Boundary Cell) |
| 1 | 0 | 0 | 0 | 1 | Off |
| 1 | 0 | 1 | 0 | 1 | |
| 1 | 1 | 0 | 0 | 1 | |
| 1 | 1 | 1 | 0 | 1 | |

Control 440 is not another control line, but instead indicates the value of the output at that location in the circuit diagram, after the first two stages of logic in FIG. 4. The ENB[n−1] value fed to the first cell is 0, the ENB[n] value continues to be 0, and Control 440 continues to be 1 in each cell, until the boundary cell, identified by R 420=1 and C 430=1. In the boundary cell, Control 440 becomes 0 and ENB[n] becomes 1, and those values continue through for the rest of the array. This is only one possible implementation of local decoder logic to achieve the boundary cell behavior as discussed above, and many other implementations and variations are possible, as would be understood by one of ordinary skill in the art.

Figure 5C:
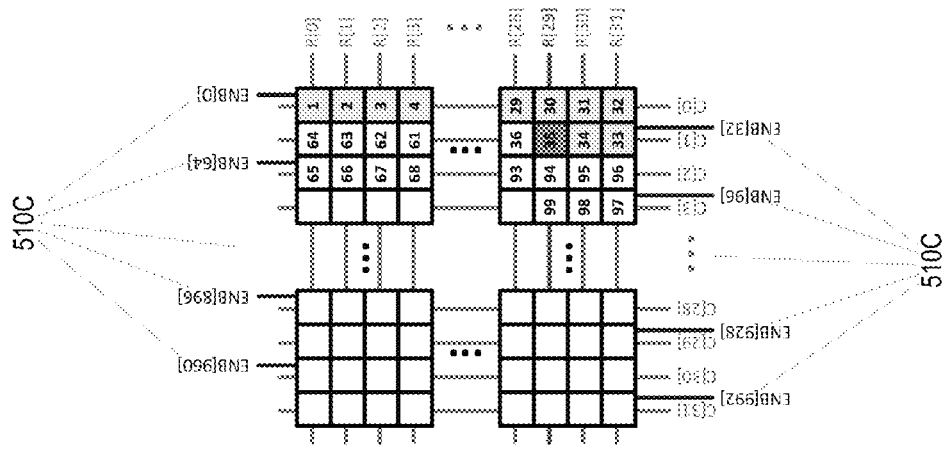
FIGS. 5A, 5B, and 5C are various implementations of a Fine Tuning bank comprising a 32×32 capacitive cell array in which each cell has the decoder logic of FIG. 4, according to embodiments of the present invention.
Figure 5B:
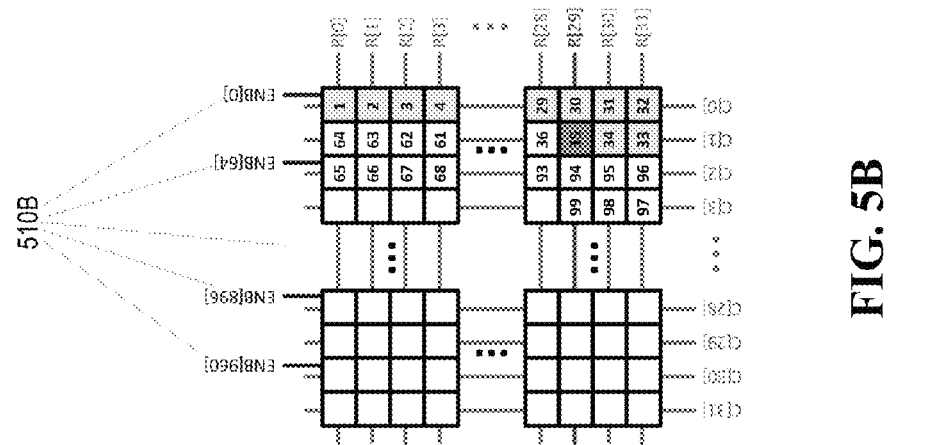
Figure 5A:
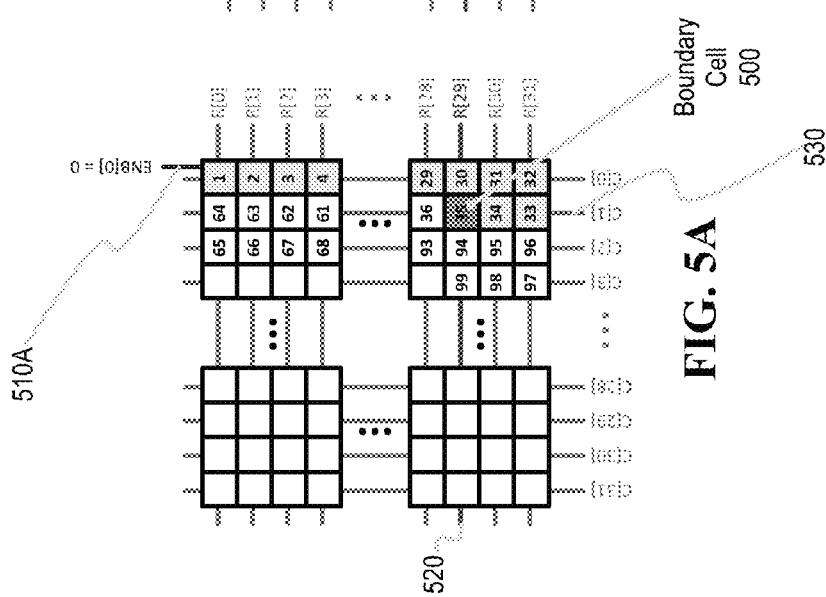

FIGS. 5A-5B-5C are various implementations of a Fine Tuning bank comprising a 32×32 capacitive cell array in which each cell has the decoder logic of FIG. 4, according to embodiments of the present invention. In the drawings, the cells are numbered in accordance with how they are turned on and off, i.e., the serpentine thermometer coding. In all three drawings, row control line R[29] 520 and column control line C[1] 530 are asserted, thereby selecting the boundary cell numbered 35 and labeled 500 in FIG. 5A.

In FIG. 5A, as discussed in reference to FIG. 4, the ENB signal 510A fed the first cell, cell 1, is zero. Thus, ENB signal 510A ENB[0]=0. In FIG. 5A, all that is required is the ENB feeder signal 510A which is propagated forward through each cell until boundary cell 500, selected/identified by its row control line 520 R[29]=1 and column control line 530 C[1]=1, thereby turning the ENB[35] input into the next cell, numbered 36, a 1, which is propagated through the rest of the array.

A small delay may result from changing the state of each cell by propagating through the array. However, this does not affect the dithering of the cells in the capacitive array because dithering only involves turning on and off about 5 consecutive cells. Furthermore, ENB feeder signals can be input into several sections of the array simultaneously, as shown in FIGS. 5B and 5C.

In FIG. 5B, an ENB signal 510B is fed into the top of every other column in the array, i.e., at cell 1, cell 65 (ENB[64]), . . . , cell 897 (ENB[896]), and cell 961 (ENB[960]). Only the first ENB signal 510B would be 0, all of the remaining ENB signals would be 1. The capacitor array of FIG. 5C has an ENB feeder signal 510C for every column in the array, thereby reducing startup time even more.

As shown by the embodiments of the present invention described above, the number of control lines needed for a Fine Tuning bank in an LC-tank DCO can be reduced, and the number of control lines needed to toggle between values while dithering is significantly reduced. Unlike the solution proposed in Vercesi et al., each control line in embodiments of the present invention only drives one row or column. Unlike the solution proposed in Da Dalt et al., the layout of every cell in embodiments of the present invention can be identical. Moreover, the implementation of logic/circuitry for the cell state machine is very flexible, capable of being implemented in a wide variety of circuit types.

Although the embodiments described above concern controlling a Fine Tuning bank in an LC-tank DCO of a Phase-Locked Loop (PLL), other embodiments of the present invention may be applied to controlling other large arrays of unit cells like digital-to-analog converters (DACs).

Depending on the embodiment of the present invention, some or all of the steps and/or operations may be implemented or otherwise performed, at least in part, on a portable device. "Portable device" as used herein refers to any portable, mobile, or movable electronic device having the capability of receiving wireless signals, including, but not limited to, multimedia players, communication devices, computing devices, navigating devices, etc. Thus, mobile devices include (but are not limited to) laptops, tablet computers, Portable Digital Assistants (PDAs), mp3 players, handheld PCs, Instant Messaging Devices (IMD), cellular telephones, Global Navigational Satellite System (GNSS) receivers, watches, or any such device which can be worn and/or carried on one's person.

Depending on the embodiment of the present invention, some or all of the steps and/or operations may be implemented or otherwise performed, at least in part, using one or more processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof. Moreover, the functionality of any "module" discussed herein may be implemented in software, firmware, hardware, and/or any combination thereof.

The one or more non-transitory computer-readable media and/or means for implementing/performing one or more operations/steps/modules of embodiments of the present invention may include, without limitation, application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of any system components and/or data structures may also be stored as contents (e.g., as executable or other non-transitory machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of any system components and data structures may also be stored as data signals on a variety of non-transitory computer-readable transmission mediums, from which they are read and then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced in any computer system configuration.

Thus, the term "non-transitory computer-readable medium" as used herein refers to any medium that comprises the actual performance of an operation (such as hardware circuits), that comprises programs and/or higher-level instructions to be provided to one or more processors for performance/implementation (such as instructions stored in a non-transitory memory), and/or that comprises machine-level instructions stored in, e.g., firmware or non-volatile memory. Non-transitory computer-readable media may take many forms, such as non-volatile and volatile media, including but not limited to, a floppy disk, flexible disk, hard disk, RAM, PROM, EPROM, FLASH-EPROM, EEPROM, any memory chip or cartridge, any magnetic tape, or any other magnetic medium from which a computer instruction can be read; a CD-ROM, DVD, or any other optical medium from which a computer instruction can be read, or any other non-transitory medium from which a computer instruction can be read.

While several embodiments of the present invention have been shown and described herein, it will be understood by those of ordinary skill in the art that various changes in form and details may be made therein without departing from the spirit and scope of the present invention—i.e., the invention is not limited to any embodiments described herein, but is defined by the appended claims and their equivalents.

What is claimed is:

1. An array of capacitor cells that produce a variable capacitance, comprising:
   n row control lines;
   n column control lines; and
   an n×n array of capacitor cells which varies its overall capacitance by thermometer coding forming a path through the n×n array, each capacitor cell comprising:
      a feeder input for at least one of output of a previous cell in the path or output from a feeder line;
      a column control line input;
      a row control line input; and
      an output for the feeder input of a next cell in the path,
   wherein each cell in the array is in one of two states;
   wherein a boundary cell is selected by asserting its row control line input among the n row control lines and asserting its column control line input among the n column control lines,
   wherein all cells before the boundary cell in the path output a value of the feeder line connected to the feeder input of a first cell in the path, wherein the first cell is in a first column and a first row of the array of capacitor cells,
   wherein the boundary cell and all cells after the boundary cell in the path output a value opposite to the value of the feeder line connected to the first cell in the path, and
   wherein each cell before the boundary cell in the path is in a first state of the two states, and the boundary cell and each cell after the boundary cell is in a second state of the two states.

2. The capacitor cell array of claim 1, wherein the value input by the feeder line into the first cell in the path grounds each cell in the path before the boundary cell.

3. The capacitor cell array of claim 1, wherein the first state comprises being grounded and the second state comprises being connected to a source voltage.

4. The capacitor cell array of claim 1, further comprising:
at least one feeder line in addition to the feeder line into the first cell in the path, wherein the at least one feeder line inputs a value into a cell later in the path.

5. The capacitor cell array of claim 1, wherein the values comprise 0 and 1.

6. The capacitor cell array of claim 1, wherein each cell further comprises:
circuitry capable of implementing the following truth table:

| the feeder input | the column control line input | the row control line input | the output | the state |
|---|---|---|---|---|
| 0 | 0 | 0 | 0 | ON |
| 0 | 0 | 1 | 0 | ON |
| 0 | 1 | 0 | 0 | ON |
| 0 | 1 | 1 | 1 | OFF |
| 1 | 0 | 0 | 1 | OFF |
| 1 | 0 | 1 | 1 | OFF |
| 1 | 1 | 0 | 1 | OFF |
| 1 | 1 | 1 | 1 | OFF | wherein ON and OFF in the last column correspond to the first state and the second state, respectively.

7. The capacitor cell array of claim 1, further comprising:
a row decoder connected to the row control lines; and
a column decoder connected to the column control lines,
wherein the row decoder receives a first set of bits from a frequency control word and asserts at least one of the row control lines based on the first set of bits, and
wherein the column decoder receives a second set of bits from a frequency control word and asserts at least one of the column control lines based on the second set of bits.

8. An inductance/capacitive (LC) tank for a digitally controlled oscillator (DCO), comprising a coarse tuning bank and a fine tuning bank, wherein the fine tuning bank comprises the capacitor cell array of claim 1.

9. A portable device comprising a phase-locked loop (PLL) having the LC tank and DCO of claim 8.

10. A method for producing a variable capacitance, comprising:
selecting a boundary cell by asserting a row control line and a column control line to select a boundary cell in an array of capacitor cells which varies its overall capacitance by thermometer coding forming a path through the array, wherein each cell in the array is either grounded or electrically connected to a voltage source; and
providing a specific capacitance whose value is determined by having all cells before the boundary cell in the path being grounded, and having the boundary cell and all cells after the boundary cell in the path being electrically connected to the voltage source.

11. The method of claim 10, wherein each cell except the boundary cell is grounded if a cell preceding the cell in the path is grounded, or electrically connected to the voltage source if the preceding cell in the path is electrically connected to the voltage source.

12. The method of claim 10, further comprising:
inputting a value into a first cell in the path which causes the first cell to be grounded, wherein the first cell is in a first column and a first row of the array of capacitor cells.

13. The method of claim 12, further comprising:
inputting the value which causes the first cell to be grounded into one or more cells before the boundary cell in the path in order to more quickly propagate the value in the path.

14. The method of claim 13, further comprising:
inputting a value which causes a cell to be electrically connected to the voltage source into one or more cells after the boundary cell in the path in order to more quickly propagate the value which causes a cell to be electrically connected in the path.

15. The method of claim 10, further comprising:
receiving a frequency control word comprising a first set and second set of bits,
wherein the first set of bits is used to select which row control line to assert, and
wherein the second set of bits is used to select which column control line to assert.

16. The method of claim 15, wherein the frequency control word indicates the specific capacitance to be provided by the array of capacitor cells.

17. The method of claim 10, wherein each cell comprises:
a feeder input for at least one of output of a previous cell in the path or output from a feeder line;
a column control line input;
a row control line input; and
an output for the feeder input of a next cell in the path,
wherein the method further comprises:
providing, by each cell, the output indicated by the following truth table when receiving the input as indicated in the following truth table:

| the feeder input | the column control line input | the row control line input | the output | the state |
|---|---|---|---|---|
| 0 | 0 | 0 | 0 | GND |
| 0 | 0 | 1 | 0 | GND |
| 0 | 1 | 0 | 0 | GND |
| 0 | 1 | 1 | 1 | $V_{source}$ |
| 1 | 0 | 0 | 1 | $V_{source}$ |
| 1 | 0 | 1 | 1 | $V_{source}$ |
| 1 | 1 | 0 | 1 | $V_{source}$ |
| 1 | 1 | 1 | 1 | $V_{source}$ | wherein GND and $V_{source}$ in the last column correspond to the cell being grounded or connected to the voltage source, respectively.

18. An inductance/capacitive (LC) tank for a digitally controlled oscillator (DCO), comprising a coarse tuning bank and a fine tuning bank, wherein the fine tuning bank implements the method of claim 10.

19. A portable device comprising a phase-locked loop (PLL) having the LC tank and DCO of claim 18.

* * * * *